(12) United States Patent
Ohl et al.

(10) Patent No.: US 9,883,300 B2
(45) Date of Patent: Jan. 30, 2018

(54) METHOD AND APPARATUS FOR CONTROLLING A HEARING INSTRUMENT TO RELIEVE TINITUS, HYPERACUSIS, AND HEARING LOSS

(71) Applicant: OTICON A/S, Smørum (DK)

(72) Inventors: Björn Ohl, Vanløse (DK); Dorthe Hofman-Bang, Smørum (DK); Marianne Philipsson, Smørum (DK); Jacob Anders Roug, Smørum (DK); Jesper Nøhr Hansen, Smørum (DK); Gary Jones, Smørum (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 15/049,988

(22) Filed: Feb. 22, 2016

(65) Prior Publication Data
US 2016/0249145 A1    Aug. 25, 2016

(30) Foreign Application Priority Data

Feb. 23, 2015   (EP) ..................... 15156168

(51) Int. Cl.
*H04R 25/00* (2006.01)
*H03G 3/02* (2006.01)
*H03G 3/30* (2006.01)

(52) U.S. Cl.
CPC .............. *H04R 25/75* (2013.01); *H03G 3/02* (2013.01); *H03G 3/3026* (2013.01); *H04R 25/558* (2013.01); *H04R 25/552* (2013.01); *H04R 2225/39* (2013.01); *H04R 2225/61* (2013.01); *H04R 2430/01* (2013.01)

(58) Field of Classification Search
CPC .... H04R 25/554; H04R 3/00; H04R 2430/01; H04R 25/50
USPC ......................... 381/73.1, 23.1, 107, 320, 317
See application file for complete search history.

(56) References Cited

U.S. PATENT DOCUMENTS

| | | | |
|---|---|---|---|
| 5,403,262 A | 4/1995 | Gooch | |
| 6,047,074 A | 4/2000 | Zoels et al. | |
| 2004/0131200 A1* | 7/2004 | Davis | A61B 5/121 381/73.1 |
| 2008/0064993 A1* | 3/2008 | Abolfathi | A61M 21/00 601/47 |
| 2013/0202119 A1* | 8/2013 | Thiede | A61B 5/0482 381/23.1 |
| 2015/0199977 A1* | 7/2015 | Ungstrup | H04R 25/55 704/260 |

(Continued)

FOREIGN PATENT DOCUMENTS

| | | |
|---|---|---|
| EP | 1205904 A1 | 5/2002 |
| WO | WO 2014/206446 A1 | 12/2014 |
| WO | WO 2015/010031 A1 | 1/2015 |

*Primary Examiner* — Mohammad Islam
(74) *Attorney, Agent, or Firm* — Birch, Stewart, Kolasch & Birch, LLP

(57) ABSTRACT

A hearing instrument and a method for operating a hearing instrument for relieving tinnitus, hyperacusis, and/or hearing loss is provided. The hearing instrument and/or the method includes receiving and manipulating an audio signal at a signal processor to create a manipulated audio signal, providing a tinnitus relief sound having an operational level based on a present volume level from an audio signal, and generating an output signal based on the manipulated audio signal and the tinnitus relief sound.

18 Claims, 3 Drawing Sheets

(56) References Cited

U.S. PATENT DOCUMENTS

Figure 1:
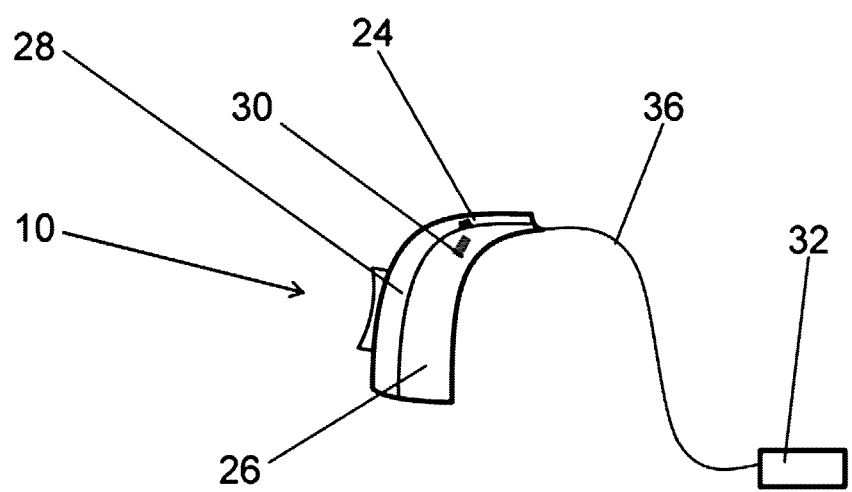

2016/0142029 A1* 5/2016 Putta .................... H04R 3/00
381/107

* cited by examiner

METHOD AND APPARATUS FOR CONTROLLING A HEARING INSTRUMENT TO RELIEVE TINITUS, HYPERACUSIS, AND HEARING LOSS

The present disclosure relates to a hearing instrument and a method of operating such a hearing instrument. More particularly, the disclosure relates to a hearing instrument configured to, in addition to hearing loss compensation, provide tinnitus relief to a person and an associated method of operating such an instrument. The method and/or instrument are advantageous for relieving hearing related conditions, including tinnitus and/or hyperacusis and/or hearing loss.

A hearing impaired person using a hearing instrument for compensating his/her hearing impairment can additionally be bothered by a tinnitus. A conventional approach for treating tinnitus is to emit a sound through the hearing instrument that either compensates the tinnitus noise by means of a destructive interference or that disturbs the source of the tinnitus, such as hair cells or subsequent auditory functionality, in generating the tinnitus.

Tinnitus may be seen as the perception of sound in the absence of corresponding external sounds. Tinnitus may be caused by injury, infection or the repeated exposure of loud sound, and may appear in one or both ears. Although known for its high-pitched ringing, tinnitus may be seen as an internal noise that varies in its pitch and frequency. Tinnitus have also often been described as a "buzz", "ring", "hiss", "hum," or the like. The sound perceived may range from a quiet background noise to a signal loud enough to drown out all outside sounds.

Hyperacusis may be defined as a reduced tolerance to normal environmental sounds. Hyperacusis sufferers range from someone mildly uncomfortable in a normal sound setting to someone profoundly discomforted by many sounds encountered in daily life. Many individuals who suffer from tinnitus and/or hyperacusis may also suffer from some form of hearing loss.

In tinnitus relief, there are predominantly two different methods being utilized and embodied in a wide variety of hearing systems or tinnitus relief systems. The first method encompasses the generation of a masking sound designed to alleviate tinnitus experienced by a person. The masking sound, which generally consists of a narrow band noise signal, provides tinnitus relief by altering a person's focus from tinnitus to the masking sound.

A second method encompasses using of environmental sounds designed to habituate tinnitus experienced by a person. The environmental sounds or artificial sounds, such as band limited noise, provided to a person, which assists the person to ignore the tinnitus. Environmental sounds may be sets of recorded sounds provided to the person or may be artificially generated sounds by, for example, amplitude modulation of a noise signal. Utilizing sets of recorded environmental sounds in a hearing instrument may become troublesome, as it requires a rather extensive memory capacity, which is not as such readily present in a hearing instrument. On the other hand, when utilizing artificial or synthetic sounds it may become either so repetitive that the sound becomes annoying for a person or in the alternative so non-repetitive that a person completely attunes to the artificial sound that the tinnitus may resurface in the person's sound perception.

The tinnitus sufferer may feel a need for being able to control the tinnitus relief sounds, but a hearing care professional may also need to ensure that the wearer receives at least a minimum level of tinnitus relief.

According to the present disclosure, the tinnitus relief signal may be generated using e.g. a noise signal based on a random or pseudo random generator, and may include modulation of the amplitude and/or frequency and/or phase. A filter may be applied to the tinnitus signal, e.g. a notch filter, band pass filter, high or low pass filter or the like or even a combination of filters. The noise may be white, pink, brown, grey or any other type/colour of noise.

The tinnitus relief signal may undergo other signal processing, e.g. limiting of the output signal power so as to ensure a maximum total power output to the user, either in total or in certain frequency band or bands. The tinnitus relief signal may be imposed on, or added to, the signal which has been processed or manipulated for compensating the users hearing loss. This means that the hearing instrument e.g. records an environmental signal via an input transducer, e.g. as a digitized microphone signal, the recorded environmental signal is then processed, e.g. by applying a frequency dependent gain or other suitable processing, and the processed signal is then added with the tinnitus relief sound. The processed signal and the tinnitus relief sound may be individually analyzed so as to ensure that the output signal does not exceed a given volume threshold or the combined signal may be analyzed so as to ensure that the output signal does not exceed a given volume threshold. Further, the output signal may be even further processed to ensure that feedback is suppressed or alleviated. In the present description, the terms 'wearer' and 'user' are used interchangeably and is meant to cover the same, namely the person using/wearing a hearing instrument having one or more of the described functionalities.

The present disclosure relates in particular to a method for controlling a hearing instrument for relieving tinnitus, hyperacusis, and/or hearing loss. The method may comprise a) receiving and manipulating an audio signal at a signal processor to create a manipulated audio signal. This receiving and manipulating could be performed using a haring instrument with one or more microphones and a sound processor, such as an amplifier and the like. The method may further comprise b) providing a tinnitus relief sound, this could be provided from an internal storage, be generated based on stored algorithms, be generated by manipulating a noise signal, retrieved from an external source, either streamed or downloaded, or by any other suitable way. The method may further comprise c) generating an output signal based on the manipulated audio signal and the tinnitus relief sound, this could be by a combination of the two signals in the digital domain or in analogue domain and then the method may further comprise d) providing the output signal to an output transducer. The output transducer could be a speaker providing an audio signal to the user's ear canal, either as a behind-the-ear device or a receiver-in-the-ear device.

The method may further comprise providing a volume control to the hearing instrument, the volume control providing a volume control signal to the tinnitus relief sound, the volume control may have a volume first step size when the volume level is within a first range from a predefined level and the volume control may have a second step size when the volume level is above the first range from the predefined level. This would allow the user to have a better experience with controlling the volume level of the tinnitus relief sound.

The method may include in a first period of time from initiation of the tinnitus relief sound the volume level of the tinnitus relief sound is increased from an initialization level to an operational level. This may improve the user's comfort and satisfaction when using the tinnitus relief sounds and thereby improve the effect of the relief sound.

The method may include in a second period of time from deactivation of the tinnitus relief sound the volume level of the tinnitus relief sound is decreased from an operational level to a deactivation level.

The method may include a wearer being presented with one or more questions relating to the present state of the wearers tinnitus and the tinnitus relief sound is adapted based on input from the user's wearer's answers to the one or more questions. These questions may be presented using a hand held device, such as a smart phone, so that a system may automatically adapt the tinnitus relief sounds based on the answers to the questions. One or more questions may be asked each time the user is presented with a question. The method may include the level of the tinnitus relief sound being adapted based on the usage of the tinnitus relief sound.

The method may include the level of the tinnitus relief sound being increased as a function of number of times the tinnitus relief sound has been used and/or the period of time the tinnitus relief sound has been used and/or the level of the tinnitus relief sound is decreased as a function of number of times the tinnitus relief sound has been used and/or the period of time the tinnitus relief sound has been used. This is contemplated to provide a better adaptation of the relief sounds as the user may not him or herself be aware that adaptation is needed.

The method may include the volume level of the tinnitus relief sound being limited by information of the wearer's hyperacusis.

The method may include that the tinnitus relief sound include blue, pink, violet or grey colored noise. Further, the tinnitus relief sound may include manipulation of a noise signal, such as blue, pink, violet or grey colored noise, such as modulation of amplitude and/or frequency and/or phase of the noise signal.

The method may include the hearing instrument being part of a binaural hearing system, the hearing instrument and a second hearing instrument communicates via a communication link, the hearing instrument and the second hearing instrument exchanging information so that onset of the tinnitus relief sound in the hearing instrument and the second hearing instrument are offset by an offset time. This will provide tinnitus relief to both ears of the user.

The method may include that the tinnitus relief sound has a finite duration, and the offset time is a fraction of the length of the tinnitus relief sound duration. The method may then include that the fraction is in the range 0.1 to 0.9, such as in the range 0.2 to 0.8, such as in the range 0.3 to 0.7, such as in the range 0.4 to 0.6, such as in the range 0.1 to 0.2, such as in the range 0.2 to 0.3, such as in the range 0.3 to 0.4, such as in the range 0.4 to 0.5, such as in the range 0.5 to 0.6, such as in the range 0.6 to 0.7, such as in the range 0.7 to 0.8, such as in the range 0.8 to 0.9, such as 0.5.

Further, the present disclosure relates to a hearing device comprising an input transducer adapted to transform an input signal to an electrical signal, a processor adapted to process the electrical signal, a tinnitus relief sound source providing a tinnitus relief sound, and an output transducer adapted to output a signal based on the processed electrical signal and/or the tinnitus relief sound. The hearing device, or hearing instrument, may be of a behind-the-ear type, a receiver-in-the-ear type, an in-the-ear type, a completely-in-the-canal type, bone anchored type, or any other suitable type.

The hearing device, or hearing instrument, preferably includes that the processor is adapted to perform any one of the steps according to any of the methods described in the present disclosure.

The hearing device may further include a volume control configured to control the volume of the tinnitus relief sound based on input from a wearer of the hearing device. This may be positioned on a housing of the hearing device, e.g. as a protruding button or wheel, or any other type of input such as using one or more capacitive sensors. The hearing device may include that the volume control is a button on the device or formed or established using an external device, such as a mobile phone or computer device. In some instances, the external device may be configured to communicate with the hearing device using wireless communication, and the hearing device is configured to receive wireless communication from the external device. The wireless communication may be based on inductive communication using coils and magnetic signals, or it could be based on RF-frequency, short-range communication, such as Bluetooth based or the like.

In a further aspect, if a hearing instrument is part of a hearing system with two hearing instruments, each hearing instrument may have the same implementation of a tinnitus relief sound. The tinnitus relief sound generated on the left and right side are preferably identical and finite and may be presented to the user as repeated in endless loops. Practically, the sampling rate of a hearing instrument is likely to deviate from its nominal value by a few percent, because the chip's clock speed cannot be controlled with sufficient precision. Despite the offset, the sampling rate is, however, stable. A difference in sampling rate between the left and right hearing instrument means that the duration of the same tinnitus relief sound is slightly different in the two instruments. Therefore it is inevitable that the faster instrument will, at some point, 'lap' the slower instrument, i.e. it will catch up and eventually get ahead of the slower instrument by an integer amount of tinnitus relief sequence cycles. When this happens, the tinnitus relief sequences in the left and right instrument are identical for a brief moment.

Perceptually, two independent tinnitus relief sound sequences on the left and right side (dichotic sound presentation) result in a diffuse sound impression localized outside of the head, i.e. without a specific sound location. If the tinnitus relief sounds are identical (diotic sound presentation), the sound is perceived as localized in the middle of the head, which is, most often, not preferable.

Therefore, there is a need to provide a solution that addresses at least some of the above-mentioned problems. The present disclosure provides at least an alternative to the prior art.

It is an object of the present disclosure to provide a hearing instrument offering an improved tinnitus treatment possibility. It is furthermore an object of the present disclosure to provide a corresponding operating method of operating a hearing instrument and a corresponding computer program. A method may be a method for treating one or more audio related conditions, including, but not limited to, tinnitus, hyperacusis and/or hearing loss. The method may include alleviating tinnitus and hyperacusis with auditory stimulation by compensating for hearing loss and/or loss of non-linear compression.

According to a first aspect, this disclosure describes a hearing instrument for providing an artificial sound for habituating tinnitus by means of generating a synthetic habituation sound signal for assisting a person in removing the tinnitus from the person's perception. The synthetic habituation sound signal may be generated by modulating a noise signal by a preprogrammed modulation scheme that may simulate environmental sounds, which commonly are experienced by person's in their everyday activities or by person's as soothing sounds. For example, this may be "Wind in trees" or "Waves on a beach" or "rain" or "turbulent river".

The modulation is controllable by a pre-programmed modulation sequence thereby providing a resulting a synthetic habituation sound, which on the one hand is pleasing for the person to listen to, and on the other hand prevents the person in attuning to the habituation sound. The pre-programmed modulation sequence may be established through a frequency modulation synthesis, wavetable synthesis or by other means of general understanding of the underlying environmental sounds that need to become a habituation sound.

The length of the pre-programmed modulation sequence may vary according to the memory available on a hearing instrument or an accessory to a hearing instrument. As indicated by Bristow-Johnson (1996) the wavetable synthesis fundamentally is a periodic repetition of a waveform such as a pre-programmed sound sequence, and the therefore the periodicity is determined by the available memory space of the hearing instrument or hearing instrument accessory.

To obtain the habituation sound described here, the pre-programmed modulation sequence may be repeated consistently over and over again, until the tinnitus relief function is disabled either manually or by expiry of a given period of time. The length of the preprogrammed modulation sequence is as described above confined or restricted at least by the memory of the hearing instrument or a hearing instrument accessory connected to the hearing instrument, especially if the entire signal is stored. However, the programmer may, based on a dialogue with the person wearing the hearing instrument, vary parameters in the program to accommodate the person's immediate desires. Generally, the preprogrammed modulation scheme avoids acoustically prominent features and preferably has a length equivalent of 1 to 6 minutes, such as between 1 and 2 minutes, 2 and 3 minutes, 3 and 4 minutes, 4 and 5 minutes, or 5 and 6 minutes, or such as between 2 and 5 minutes. Other periods may be used, such as up to 30 minutes.

According to an aspect, a method or device may include steering the tinnitus relief sound based on the sound pressure level of the environment, e.g. as measured at the input transducer. This could include lowering the tinnitus relief sound level when the input level is above a certain threshold. The threshold could be set in the input level range of 30 to 80 dB, such as 40 to 60 dB, such as around 50 dB, such as around 60 dB. The tinnitus relief lowering could be in the range of 5 to 20 dB. The lowering could be as a function of input level, such as 0.25 dB lowering of tinnitus relief level per 1 dB increase in sound level, such as 0.5 dB lowering of tinnitus relief level per 1 dB increase in sound level, such as 1 dB lowering of tinnitus relief level per 1 dB increase in sound level, such as 1.5 dB lowering of tinnitus relief level per 1 dB increase in sound level, such as 2 dB lowering of tinnitus relief level per 1 dB increase in sound level. A second threshold could be defined as a lower level of the tinnitus relief sound level, where the decrease of the tinnitus relief sound level stop. This could be in the range of 5 dB higher than the threshold, such as 10 dB higher than the threshold, such as 15 dB higher than the threshold, such as 20 dB higher than the threshold. These functions could advantageously be implemented in a hearing instrument.

According to another aspect, the present disclosure describes a hearing instrument configured to provide tinnitus relief to a wearer, where during a first period of time the tinnitus relief sound signal have an initial tinnitus sound level, the sound level of the tinnitus relief sound level being increased to a higher operational tinnitus sound level. The increase in tinnitus relief sound level is preferably controlled by an automated process in the time period. The tinnitus relief sound may be increased gradually, e.g. in steps, continuously or a combination thereof. The tinnitus relief sound being provided to the wearer at the operational tinnitus sound level for a period of time. This period of time may either be when the user decides that the tinnitus relief sound is not to be played any more, or a predefined period of time having passed. After this period the tinnitus relief sound may be stopped. The stopping of the tinnitus relief sound may involve a decrease from the operation tinnitus sound level to none over an end time period. During the end time period the tinnitus relief sound may be decreased gradually, e.g. in steps, continuously or a combination thereof. As with the start period, the tinnitus relief sound level may be controlled by an automated process during the end time. The automated control may be implemented using a digital processor in the hearing instrument.

During listening tests of tinnitus relief sounds it has been experienced that people react negatively to the abrupt start of the tinnitus sound. The wearer could end up by trying to avoid the start of the tinnitus relief sound as the abrupt sound may be perceived as uncomfortable. By starting the tinnitus relief sounds at a low level, which could be e.g. −20 dB of the desired operational level, and then fade up to the desired level within seconds, the tinnitus relief sound will be perceived more as more gentle by the wearer.

According to yet another aspect, a hearing instrument providing tinnitus relief sounds to a wearer includes a reverse adaptation manager for the tinnitus relief sound to accommodate for the tinnitus patients habituation of the relief sound. Over time, the tinnitus patient may habituate to the tinnitus relief sound and therefore will be able to turn down the level of the relief sound. This is advantageously done automatically, i.e. without the direct involvement of the wearer. The person performing the adaptation of the hearing instrument to the user may include adapting the adaptation period and levels.

According to yet another aspect, a hearing instrument providing tinnitus relief sounds to a wearer includes an automatic adaption of the tinnitus relief sound based on input from the user. The user may provide information on his or her state before the hearing instrument initiates a tinnitus relief sound. This provides the user with a feeling of control, and is especially useful if the wearer, in addition to tinnitus, suffers from hyperacusis. The adaptation may be implemented using fuzz logic, neural networks or other types of decision algorithms.

Preferably, the tinnitus relief sound operational level is controlled automatically based on how well the wearer has habituated to the tinnitus sound. The hearing instrument includes automatic feature to turn down (adapt) the level of the tinnitus relief sound over time. Alternatively, the hearing instrument may be operated based on input from the wearer; this input may generated based on one or more questions being posed to the user. The response or responses to the questions are analyzed and used as a basis to control the operational level of the tinnitus relief sound. The questions and/or answers and/or other input may be provides via a mobile phone, such as a smart phone. This may provide the wearer with a graphical user interface and/or audio presentation of one or more questions. The question or questions may be stored in a database. A neural network or other kind of analysis tool may be used to select one or more questions and/or analyze response from the wearer. The wearer could enter the current state, e.g. daily, of the tinnitus, and could be from a tinnitus handicap inventory, THI, or a tinnitus functional index, TFI, score (tinnitus questionnaires). The options for answers could include yes/no/sometimes or other answer possibilities. The answers could include a score value indicating a level as a response. The answers may be weighted to form a basis for the control of the tinnitus relief sound.

According to yet another aspect, the present disclosure provides a hearing instrument including tinnitus relief to a wearer, wherein the tinnitus relief sound having a power density that increases with the frequency. The increase could be linear, similar to blue noise, where the increase is 3 dB per octave, with increasing frequency (density proportional to f) over a finite frequency range. The increase in the signals power density could increase 6 dB per octave with increasing frequency, i.e. the density is proportional to f squared, over a finite frequency range. The signal could be subjected to a psychoacoustic equal loudness curve, such as an inverted A-weighting curve, over a given range of frequencies, giving the listener the perception that it is equally loud at all frequencies. This is in contrast to standard white noise, which has equal strength over a linear scale of frequencies but is not perceived as being equally loud due to biases in the human equal-loudness contour. Further, the tinnitus relief sound could be a sound where the power density has a major part in a high frequency part and a minor part in a low frequency part.

According to yet another aspect, the present disclosure provides a hearing instrument which is configured to provide a tinnitus relief sound. In tinnitus treatment with sound generators embedded in hearing instruments, the hearing care processional provides the wearer with a stimulus as an addition to the constantly perceived tinnitus. This is supposed to minimize the contrast between the tinnitus and silence. The goal is the habituation to the tinnitus, i.e. it is important that it is not masked completely, i.e. not made inaudible, because habituation cannot take place under these circumstances. Therefore, the level of the provided tinnitus relief sound is typically set such that both it and the tinnitus remain audible. Since tinnitus is typically perceived only relatively few dB above the hearing threshold, the sound provided via the sound generator is generally also relatively close to the hearing threshold.

The perception of the tinnitus loudness can vary, hence patients are generally advised to adjust the level of the provided sound at least from day to day. Therefore, it is very common to provide a tinnitus volume control for this signal. One problem is that loudness perception generally changes a lot when being close the hearing threshold. That is, a change of, say, 3 dB in level very close to the threshold will lead to a certain change in perceived loudness. If this 3 dB change is applied to a signal well above the hearing threshold, the corresponding perceived loudness change is much smaller.

In terms of end user experience this means that a fixed step size might be appropriate when operating well above the hearing threshold, but it may be difficult to find the right level when being close to the threshold. In one moment the level might be too soft or even inaudible, but after adjusting the volume control one step upwards the perceived loudness might be too high, i.e. higher than desired. It can therefore be impossible to adjust the level so that the wearer gets the exact loudness he wants, because the step size is not optimal, i.e. too large, to operate so close to the hearing threshold.

Therefore, a hearing instrument according to the present disclosure may be provided with a volume control having variable step size depending on the present volume level. The present volume level is, or may be, seen in relation to a default level, wherein when the present volume level is close to the default level the volume control provides a first step size, and when the present volume level is far from the default level, the volume control provides a second step size. The determination of far or close to the default level may be determined based on a threshold. The determination of far or close to the default level may include two or more thresholds, so that three or more step sizes may be used based on the thresholds. The threshold or thresholds may be a percentage of the default level. The default level may be set as an absolute level. The maximum volume level may be determined as a total maximum output including a compensated sound signal and the tinnitus signal. Alternatively, the maximum volume output may be based on the processed signal level alone. Determining which step size to use could be based on the present tinnitus relief sound level. Alternatively, the step size to use could include the present environment sound level, i.e. the higher the sound level is in the environment the higher the step size, and vice versa.

The first step size may be in the interval 0.2 dB to 5 dB, such as 0.25 dB to 3 dB, such as 0.5 dB to 2.5 dB, such as 1 dB to 2 dB, such as around 1.5 dB, such as 1.5 dB. The second step size may be in the interval 3 dB to 6 dB, such as 3.5 dB to 5 dB, such as around 3 dB, such as 3 dB. A first step size may be 0.75 dB and a second step size may be 1.5 dB. A first step size may be 0.75 dB and a second step size may be 1.5 dB and a third step size may be 3 dB. Other combinations of the first, second and/or third step size may be useful.

Further, especially in the case where the hearing instrument comprises only one physical input, or maybe no physical input but only a remote of some sort, a further option of controlling the volume may be needed. The volume could be changed in a roll-over fashion, meaning that when the user has turned up the volume to the maximum setting, the volume could skip down to the lowest setting. This would protect the user from inadvertently turning the volume to a too high setting while at the same time indicating to the user that the volume had reached the maximum as the user will experience that the volume is decreased.

Alternatively the volume could be changed in a window-wiper fashion, meaning that e.g. when the volume reach the maximum volume then next setting will be lower and each subsequent change is treated as a decrease in volume until a minimum setting is reached thereafter each subsequent change is treated as an increase. The change then continues in this pattern. In an alternative a period of time could be defined as a delimiter, and changes occurring after the expiry of the time period could be treated as a request to increase the volume. This could mean that the user increase the volume to the maximum and thereafter continues so that the volume is decreased, in a manner as described above, but unlike before, after the expiry of the time limit where the user has not operated the volume control, the next operation is treated as an increase in volume.

According an aspect of the present disclosure, at least the above identified object is achieved by a computer program for operating a hearing instrument, the computer program comprising program code means for causing the hearing instrument to carry out the steps of the method of the present disclosure, when the computer program is run on a computer or computing unit controlling the hearing instrument.

The term 'tinnitus frequency range' of a user is in the present context to mean a frequency range around a central tinnitus frequency ft which is perceived by a user as comprising the disturbing frequencies associated with tinnitus. The tinnitus frequency range (including the central tinnitus frequency can e.g. be determined for a given user by playing a number of narrow-band sounds (e.g. pure tones or harmonic series with missing fundamentals that span small frequency range) centered at different frequencies over the human audible frequency range (e.g. between 20 Hz and 20 kHz) and have the user identify the frequency (or frequencies) that is perceived as closest to the disturbing tinnitus sounds. In an iterative procedure, the distances in frequency between the sounds played for the user can be diminished to successively more precisely identify one or more tinnitus frequency ranges (and thus corresponding central tinnitus frequency/ies). In an embodiment, more than one distinctly different (non-overlapping) tinnitus frequency ranges of a user is defined. A broadband signal may e.g. be defined as a signal that has a bandwidth larger than one third octave, e.g. larger than one octave, relative to a center frequency ft of the tinnitus frequency range.

Figure 2:
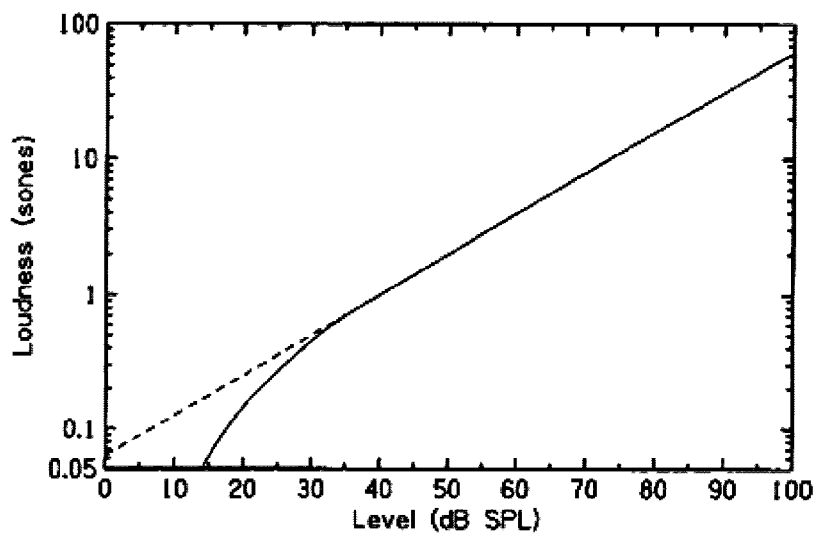
Figure 3:
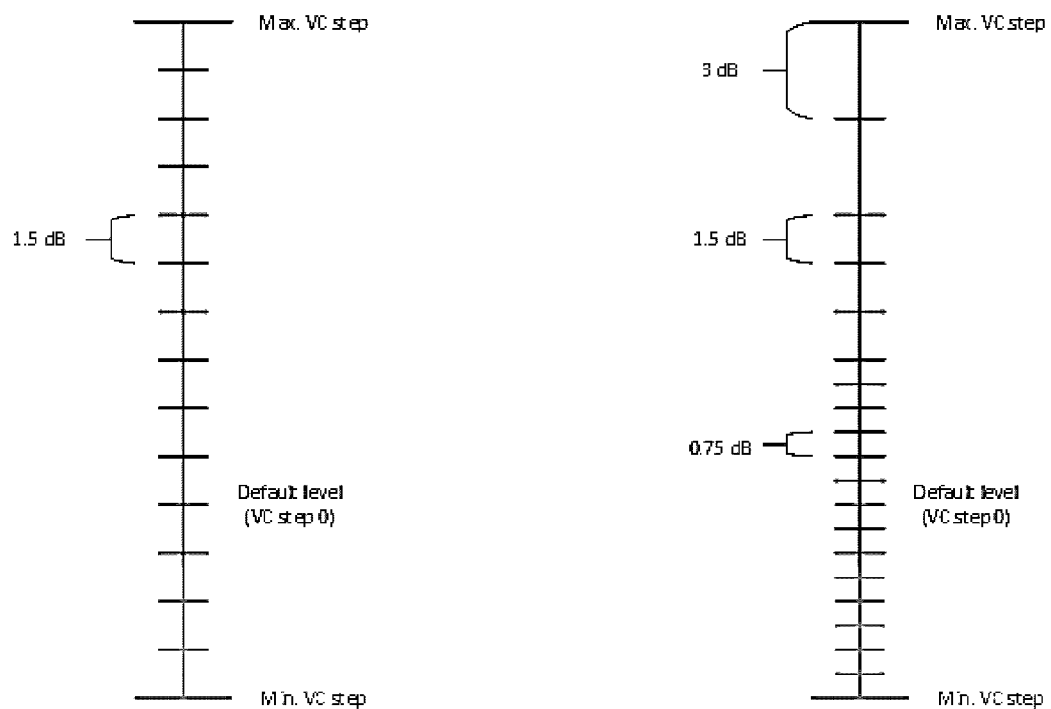

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

FIG. 1 schematically illustrates a hearing instrument,

FIG. 2 schematically illustrates loudness as a function of sound level,

FIG. 3 schematically illustrates volume control schemes; and

Figure 4:
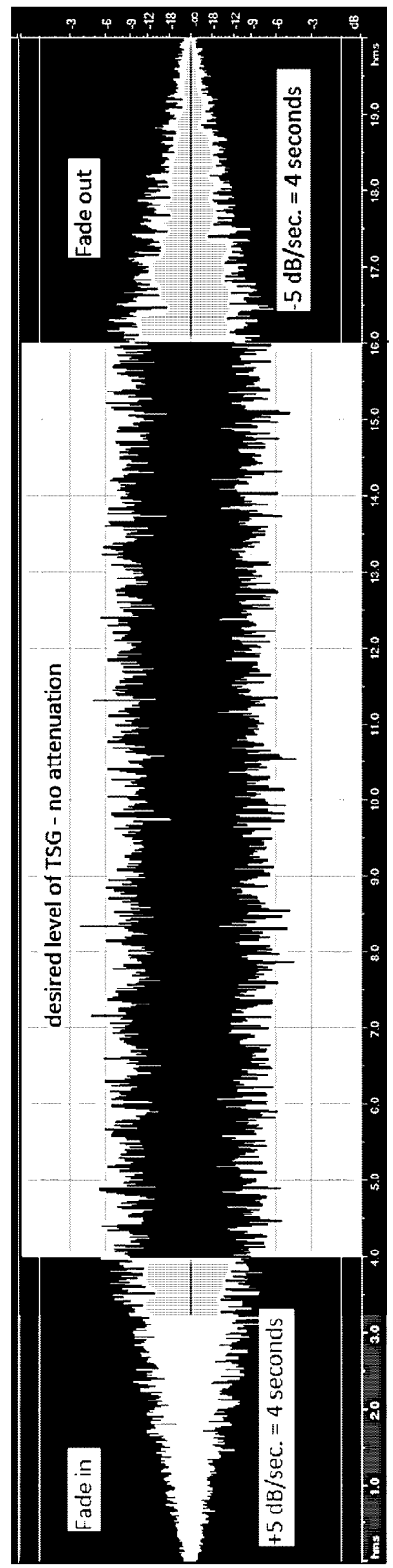

FIG. 4 schematically illustrates fade-in and fade-out period.

DETAILED DESCRIPTION

The detailed description set forth below in connection with the appended drawings is intended as a description of various configurations. The detailed description includes specific details for the purpose of providing a thorough understanding of various concepts. However, it will be apparent to those skilled in the art that these concepts may be practised without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

A hearing device may include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

The hearing device is adapted to be worn in any known way. This may include i) arranging a unit of the hearing device behind the ear with a tube leading air-borne acoustic signals into the ear canal or with a receiver/loudspeaker arranged close to or in the ear canal such as in a Behind-the-Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in Bone Anchored Hearing Aid or Cochlear Implant.

A "hearing system" refers to a system comprising one or two hearing devices, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a SmartPhone or other electronic device, the SmartPhone/ electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

Now referring to FIG. 1, which illustrates hearing instrument 10 according to an aspect of the disclosure. The hearing instrument 10 is here illustrated as a so-called RIE, Receiver-in-the-ear, type hearing instrument. The methods and features of the present disclosure is not limited to this style of hearing instrument. The hearing instrument 10 comprises a housing 26 to be worn behind the pinna and a part 32 to be worn in or at the ear canal. The part 32 in or at the ear canal comprises an output transducer, here a so-called receiver, also referred to as a loudspeaker. The output transducer provides an acoustical signal that the wearer may perceive as sound. A connector 36 connect the first part 26 and the second part 32. Electrical conductors carry the output signal from a processor 30 in the first part 26 to the output transducer in the second part 32.

The hearing instrument comprises an input transducer 24 to convert environmental sounds to electrical signals that the processor 30 in the hearing instrument is able to process. The processor processes the signals according to a wearers hearing loss. This processing usually have been determined by a hearing care professional and is intended to compensate for the wearer's hearing loss. Additionally, the hearing instrument have been programmed to provide a tinnitus relief sound as will be discussed in more detail below.

The hearing instrument 10 is configured to provide a tinnitus relief sound. The tinnitus relief sound may be provided from a memory in the hearing instrument, or alternatively from an external device. The external device could be a mobile phone, a media player device, a computer device, an intermediate or auxiliary device providing communication between the hearing instrument and another device or any other suitable external device. A remote server could be provided, where the remote server stores one or more sounds, which are then provided to the hearing instrument, either when needed or as a file to be stored in the instrument or intermediate or auxiliary device.

During listening tests of tinnitus relief sounds it has been experienced that people react negatively to the abrupt start of the tinnitus sound. The wearer could end up by trying to avoid the start of the tinnitus relief sound as the abrupt sound may be perceived as uncomfortable. By starting the tinnitus relief sounds at a low level, which could be e.g. −20 dB of the desired operational level, and then fade up to the desired level within seconds, the tinnitus relief sound will be perceived more as more gentle by the wearer.

The hearing instrument is configured to provide tinnitus relief to a wearer. When the wearer initiates the tinnitus relief sound, during a first period of time the tinnitus relief sound signal have an initial tinnitus sound level, the sound level of the tinnitus relief sound level being increased to a higher operational tinnitus sound level over the first period of time.

The initial sound level, i.e. the starting point, of the tinnitus relief sound may be e.g. −20 dB compared to the desired operational level of the tinnitus relief sound.

The tinnitus relief sound is increased gradually. This increase may be chosen to be in steps, continuously or a combination thereof. Presently a fade-rate of around 5 dB/second is regarded as pleasant to the wearer.

By setting the initial amplification to −20 dB and providing a fade-rate of 5 dB/sec, the "fade in" time period, i.e. the first period, of the tinnitus relief sound will be 4 seconds.

The tinnitus relief sound being provided to the wearer at the operational tinnitus sound level for a period of time. This period of time may either end when the user decides that the tinnitus relief sound is not to be played any more, or a predefined period of time have passed. After this period the tinnitus relief sound may be stopped.

The stopping of the tinnitus relief sound may involve a decrease from the operation tinnitus sound level to none over an end time period. During the end time period the tinnitus relief sound may be decreased gradually, e.g. in steps, continuously or a combination thereof.

Same values as the initialization period could be used for fade out, meaning that from the moment the tinnitus relief sound turn off period is started it will take 4 seconds to fade out to −20 dB and then the tinnitus relief sound will stop entirely.

FIG. 4 illustrates the three periods, namely the fade-in initialization period where the tinnitus sound is increased from the low level to the operational level, a period where the tinnitus relief sound is played at the operational level, and a fade-out period where the level of the tinnitus relief sound is decreased.

This hearing instrument provides an artificial sound for habituating tinnitus by means of generating a synthetic habituation sound signal for assisting a person in removing the tinnitus from the person's perception. The synthetic habituation sound signal may be generated by modulating a noise signal by a preprogrammed modulation scheme that may simulate environmental sounds, which commonly are experienced by person's in their everyday activities or by person's as soothing sounds. For example, this may be "Wind in trees" or "Waves on a beach". Alternatively, a synthetic habituation sound signal may be generated by modulating a pure tone signal, or signal comprising multiple tones, by a modulation scheme thereby simulating environmental sounds, music-like sounds or individual instruments.

The modulation is controllable by a pre-programmed modulation sequence thereby providing a resulting a synthetic habituation sound, which on the one hand is pleasing for the person to listen to, and on the other hand prevents the person in attuning to the habituation sound. The pre-programmed modulation sequence may be established through a frequency modulation synthesis, wavetable synthesis or by other means of general understanding of the underlying environmental sounds that need to become a habituation sound.

The length of the pre-programmed modulation sequence may vary according to the memory available on a hearing instrument or an accessory to a hearing instrument. As indicated by Bristow-Johnson (1996) the wavetable synthesis fundamentally is a periodic repetition of a waveform such as a pre-programmed sound sequence, and the therefore the periodicity is determined by the available memory space of the hearing instrument or hearing instrument accessory.

To obtain the habituation sound described here, the preprogrammed modulation sequence is repeated consistently over and over again. The length of the preprogrammed modulation sequence is as described above a confined by the memory of the hearing instrument or a hearing instrument accessory connected to the hearing instrument. However, the programmer may based on a dialogue with the person wearing the hearing instrument vary parameters in the program to accommodate the person's immediate desires. Generally, the preprogrammed modulation scheme avoids acoustically prominent features and has a length equivalent of 1 to 6 minutes, such as between 1 and 2 minutes, 2 and 3 minutes, 3 and 4 minutes, 4 and 5 minutes, or 5 and 6 minutes, or such as between 2 and 5 minutes.

The programming of the modulation sequence for synthesizing the habituation sound signal involves selecting a modulation starting point (a first sample) and from this starting point select attenuation and fading rates of each of the following modulation steps. Whenever a desired target attenuation is reached by fading the signal at the desired fade rate, the next target attenuation and fade rate are selected. This process continues until the defined memory allocation has been meet, and the execution is subsequently repeated.

The hearing instrument is further adapted to allow a user to activate a tinnitus treatment, e.g. comprising playing audio pieces, delivering pleasant sounds, etc. In the fitting process the Hearing Care Professional (HCP) may define the "treatment" schedule providing tinnitus treatment to a predefined period per day, e.g. 2 hours per day. If, however, the user of the hearing instrument (e.g. via a user interface) requests the tinnitus treatments with a certain frequency and/or a certain duration during daily use, the hearing instrument may be adapted to monitor such behavior and to increase or decrease the frequency or duration of the treatments (between certain maxima and minima, e.g. set by a HCP during fitting of the device to the user in question) based on said monitored behavior.

The hearing instrument includes programmable filters for processing received environmental sounds. The programmable filters are controlled by a signal processor. The signal processor connected downstream of the controllable filter and configured to process either the filtered or the unfiltered electric input signal according to a processing algorithm and to output a processed electric signal. The hearing instrument further includes an output transducer connected downstream of the signal processor and configured to convert the processed electric signal to an output signal to be presented to the wearer. The output signal is perceivable to the wearer as sound. This output signal may be provided as an acoustic signal, where the output transducer comprises a receiver (speaker) for providing the stimulus as an acoustic signal to the user, provided the wearer have at least some residual hearing capability, or as an electrical signal provided directly to the wearers cochlear via a cochlear implant.

Some hearing impaired persons, and some tinnitus patients, also suffers from hyperacousis (over sensitivity to loud sounds). It can especially be hard to treat these persons with tinnitus relief sounds because these persons at the same time are over-sensitive to certain sounds. This is a catch 22 situation because the person can get relief from their tinnitus by being presented with additional sound stimulation, however they do not want more sound, i.e. high sound pressure level, because it may hurt them, the hyperacusis suffering persons sometimes even wear ear protection so as not to be exposed to sound input.

An automatic tinnitus and/or hyperacousis adaptation will ensure that the person over time becomes exposed to more and more tinnitus relief sound by slowly or gradually increasing the level of the tinnitus relief sound. This means that the tinnitus relief sound in the beginning is set to a relatively low level, e.g. by a hearing care professional during an individualization of the hearing instrument, and during a period of time, either absolute time such as a month or more, or based on actual usage, the hearing instrument automatically increase the tinnitus relief sound operational level so that the wearer is gradually exposed to an increasing tinnitus relief sound and thereby relieved of his or her tinnitus without feeling discomfort due the his or her hyperacusis.

Since some wearers might not feel comfortable with giving away control of the level of tinnitus relief sound, the tinnitus relief sound level increase could be controlled by input from the user over a smart phone. This control could include asking one or more questions to the user e.g. 'how severe is your tinnitus today?', or 'How troublesome do you find the relief sound today'/'How bad is your hyperacusis today?'. These questions then form the basis for the hearing instrument to select a proper operational tinnitus relief sound level based on input from the wearer. Further, this provides the wearer with a feeling to control of the tinnitus relief sound without giving the wearer direct control of the sound level, which could lead to the user not actually benefitting from the relief sounds, e.g. feeling a relief from the tinnitus.

If a hearing instrument is part of a hearing system with two hearing instruments, and each hearing instrument have the same implementation of a tinnitus relief sound, the tinnitus relief sound generated on the left and right side are identical and often finite and may advantageously be presented to the user as repeated in endless loops. Practically, the sampling rate of a hearing instrument is likely to deviate from its nominal value by a few percent, because the chip's clock speed cannot be controlled with sufficient precision. Despite the offset, the sampling rate is, however, stable. A difference in sampling rate between the left and right hearing instrument means that the duration of the same tinnitus relief sound is slightly different in the two instruments. Therefore it is inevitable that the faster instrument will, at some point, 'lap' the slower instrument, i.e. it will catch up and eventually get ahead of the slower instrument by an integer amount of tinnitus relief sequence cycles. When this happens, the tinnitus relief sequences in the left and right instrument are identical for a brief moment.

Perceptually, two independent tinnitus relief sound sequences on the left and right side (dichotic sound presentation) result in a diffuse sound impression localized outside of the head, i.e. without a specific sound location. If the tinnitus relief sounds are identical (diotic sound presentation), the sound is localized in the middle of the head, which is not preferable. In the described problem, the lag between the two tinnitus relief sound sequences changes over time, i.e. the two tinnitus relief sound sequences are identical, but the interaural delay between them slowly approaches zero and then grows bigger again. This interaural delay (say negative at first, then zero, then positive) is perceptually interpreted as a sound source moving from one ear to the other—inside the head. This is at least the case, when the interaural delay is within +/−700 microseconds. This effect should be avoided, because it disturbs the otherwise diffuse sound impression.

In a bilateral fitting, i.e. a binaural hearing system, the tinnitus relief sound generators are now initialized with different seeds, so that they start half a sequence cycle apart from each other. Note that the underlying tinnitus relief sound sequences are in principle still identical, but each instrument starts playing it beginning at a different point of the sequence. Using a wireless link between the hearing instruments, the tinnitus relief sounds are reset to their staring point regularly, say once a minute, at the same point of time. This ensures that the two tinnitus relief sound sequences never manage to align temporally, thereby avoiding the unwanted perceptual phenomenon described above. The point in time where each hearing instrument restarts its tinnitus relief sound may be chosen based on the length of the stored tinnitus relief sound. The point in time may be varied over the duration of the application of the tinnitus relief sound.

In a hearing instrument a volume control is provided to the user. The user may control the tinnitus relief sound.

A hearing instrument according to the present disclosure implement a volume control that has an adaptive step size. Under the assumption that the default level of the sound provided in tinnitus treatment, set by the Hearing Care Professional, is generally close to the hearing threshold, one should provide a small volume control step size around this default level. This will allow the end user to make fine adjustments to the level, which will enable him or her to find just the right loudness that he or she desires. If the end user wants to make larger adjustments, the step size of the volume control will automatically become larger the higher the volume control steps go.

The perception of the tinnitus loudness can vary, hence patients are generally advised to adjust the level of the provided sound at least from day to day. Therefore, it is very common to provide a tinnitus volume control for this signal. One problem is that loudness perception generally changes a lot when being close the hearing threshold. This is illustrated in FIG. 2. That is, a change of, say, 3 dB in level very close to the threshold will lead to a certain change in perceived loudness. If this 3 dB change is applied to a signal well above the hearing threshold, the corresponding perceived loudness change is much smaller.

FIG. 3 illustrates the principles of a fixed step volume control style (left) and a variable step size volume control style (right). All numbers are just examples to illustrate the behaviour.

In a conventional volume control setup, the available range is divided into steps of equal size. Opposed to this, the hearing instrument according to the present disclosure provides smaller steps, here 0.75 dB, around the default level. When the volume has reached a certain level, the volume control increases, here the step size increases to 1.5 dB and finally 3 dB the further away from the default level one gets. This technique is not required when volume control decreases below the default level, because one gets even closer to or even below the hearing threshold for the wearer.

It is expected that tinnitus patients benefit from this adaptive step size, since they will be able to adjust the level of the provided sound in greater detail which should make it easier to find the appropriate level without over- or undershooting.

In one version, a first step size may be 0.75 dB and a second step size may be 1.5 dB and a third step size may be 3 dB. This is also illustrated in FIG. 3.

In an aspect, the functions may be stored on or encoded as one or more instructions or code on a tangible computer-readable medium. The computer readable medium includes computer storage media adapted to store a computer program comprising program codes, which when run on a processing system causes the data processing system to perform at least some (such as a majority or all) of the steps of the method described above, in the and in the claims.

By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. In addition to being stored on a tangible medium, the computer program can also be transmitted via a transmission medium such as a wired or wireless link or a network, e.g. the Internet, and loaded into a data processing system for being executed at a location different from that of the tangible medium. The wireless transmission may be based on any communications technology of relevance to a portable listening device, e.g. near-field or far-field electromagnetic communication, light communication, etc.

In an aspect, a data processing system comprising a processor adapted to execute the computer program for causing the processor to perform at least some (such as a majority or all) of the steps of the method described above and in the claims.

The method disclosed and discussed herein may be implemented as software and be executed in a hearing instrument. The hearing instrument may be part of a binaural hearing system where two hearing instruments are located as a wearers ears. The software may be stored in a memory in one or more hearing instruments.

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A method for controlling a hearing instrument for relieving tinnitus, hyperacusis, and/or hearing loss, the method comprising:
    providing a volume control signal for a tinnitus relief sound having a variable step size such that when the volume level is within a first range from a predefined level the volume control signal has a first step size and when the volume level is above the first range from the predefined level the volume control signal has a second step size
    receiving and manipulating an audio signal at a signal processor to create a manipulated audio signal;
    determining the present volume level from the audio signal,
    providing a tinnitus relief sound having an operational level based on the present volume level,
    generating an output signal based on the manipulated audio signal and the tinnitus relief sound,
    providing the output signal to an output transducer,
    presenting, using a user interface of an external device, a wearer of the hearing instrument with one or more predefined questions retrieved from a database, the one or more questions relating to the present state of the wearers tinnitus; and
    adapting the operational level of the tinnitus relief sound based on input from the wearer's answers to the one or more questions,
    wherein when providing the output signal to an output transducer,
        in a first period of time from initiation of the tinnitus relief sound, the volume level of the tinnitus relief sound is increased from an initialization level to the operational level at a predefined fade-in rate, and
        in a second period of time from deactivation of the tinnitus relief sound the volume level of the tinnitus relief sound is decreased from the operational level to a deactivation level after a deactivation of the tinnitus relief sound by the wearer at a predefined fade-out rate.

2. The method according to claim 1, wherein the tinnitus relief sound is increased by a processor in the hearing instrument without any further interaction by the wearer.

3. The method according to claim 1, wherein the level of the tinnitus relief sound is adapted based on the usage of the tinnitus relief sound.

4. The method according to claim 1, wherein the level of the tinnitus relief sound is increased as a function of number of times the tinnitus relief sound has been used and/or the period of time the tinnitus relief sound has been used and/or the level of the tinnitus relief sound is decreased as a function of number of times the tinnitus relief sound has been used and/or the period of time the tinnitus relief sound has been used.

5. The method according to claim 1, wherein the volume level of the tinnitus relief sound is limited by information of the wearer's hyperacusis.

6. The method according to claim 1, wherein the tinnitus relief sound include white, brown, blue, red, violet or grey colored noise, alternatively wherein the tinnitus relief sound include modulated white, brown, blue, red, violet or grey colored noise.

7. The method according to claim 1, wherein the hearing instrument is part of a binaural hearing system, the hearing instrument and a second hearing instrument communicates via a communication link, the hearing instrument and the second hearing instrument exchanging information so that onset of the tinnitus relief sound in the hearing instrument and the second hearing instrument are offset by an offset time.

8. The method according to claim 7, wherein tinnitus relief sound has a finite duration, and the offset time is a fraction of the length of the tinnitus relief sound duration.

9. The method according to claim 8, wherein the fraction is in the range 0.1 to 0.9.

10. A hearing device comprising:
    an input transducer adapted to transform an input signal to an electrical signal,
    a processor adapted to process the electrical signal,
    a tinnitus relief sound source providing a tinnitus relief sound,
    an output transducer adapted to output a signal based on the processed electrical signal and/or the tinnitus relief sound, wherein
    the processor is configured to
        present, using a user interface of an external device, a wearer of the hearing instrument with one or more predefined questions retrieved from a database, the one or more questions relating to the present state of the wearers tinnitus; and
        adapting an operational level of the tinnitus relief sound based on input from the wearer's answers to the one or more questions,
        increase, during a first period of time from initiation of the tinnitus relief sound, the volume level of the tinnitus relief sound from an initialization level to the operational level at a predefined fade-in rate, and
        decrease, during a second period of time from deactivation of the tinnitus relief sound, the volume level of the tinnitus relief sound from the operational level to a deactivation level at a predefined fade-out rate.

11. The hearing device according to claim 10, further including a volume control configured to control the volume of the tinnitus relief sound based on input from a wearer of the hearing device.

12. The hearing device according to claim 11, wherein the volume control is a button or formed using an external device.

13. The hearing device according to claim 12, wherein the external device is configured to communicate with the hearing device using wireless communication, and the hearing device is configured to receive wireless communication from the external device.

14. A hearing device comprising:
an input transducer adapted to transform an input signal to an electrical signal,
a processor adapted to process the electrical signal,
a tinnitus relief sound source providing a tinnitus relief sound,
an output transducer adapted to output a signal based on the processed electrical signal and/or the tinnitus relief sound, wherein the processor is adapted to perform any one of the steps according to claim 1, wherein
in a first period of time from initiation of the tinnitus relief sound the volume level of the tinnitus relief sound is increased from an initialization level to an operational level at a predefined fade-in rate, and
in a second period of time from deactivation of the tinnitus relief sound the volume level of the tinnitus relief sound is decreased from an operational level to a deactivation level after a deactivation of the tinnitus relief sound by the wearer at a predefined fade-out rate.

15. The method according to claim 1, wherein a wearer is presented with one or more questions relating to the present state of the wearers tinnitus and the tinnitus relief sound is adapted based on input from the wearer's answers to the one or more questions.

16. The method according to claim 1, wherein the fade-in rate during the first period of time is 5 dB/second.

17. The method according to claim 1, wherein the fade-out rate during the second period of time is 5 dB/second.

18. The method according to claim 1, wherein providing a tinnitus relief sound comprises:
generating the tinnitus relief sound by modulating a noise signal by a preprogrammed modulation scheme,
wherein the preprogrammed modulation scheme is established though a frequency modulation synthesis.

* * * * *